United States Patent
Poole et al.

(10) Patent No.: US 7,501,014 B2
(45) Date of Patent: Mar. 10, 2009

(54) FORMALDEHYDE FREE ELECTROLESS COPPER COMPOSITIONS

(75) Inventors: Mark A. Poole, Shrewsbury, MA (US); Andrew J. Cobley, Coventry (GB); Amrik Singh, Coventry (GB); Deborah V. Hirst, Nuneaton (GB)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 73 days.

(21) Appl. No.: 11/825,549

(22) Filed: Jul. 6, 2007

(65) Prior Publication Data

US 2008/0038451 A1    Feb. 14, 2008

Related U.S. Application Data

(60) Provisional application No. 60/819,249, filed on Jul. 7, 2006.

(51) Int. Cl.
*C23C 18/38* (2006.01)
*C23C 18/40* (2006.01)
*B05D 5/12* (2006.01)
*H05K 3/18* (2006.01)

(52) U.S. Cl. .................... 106/1.23; 106/1.26; 427/97.9; 427/443.1

(58) Field of Classification Search ................ 106/1.23, 106/1.26; 427/97.9, 443.1
See application file for complete search history.

(56) References Cited

U.S. PATENT DOCUMENTS

| | | | |
|---|---|---|---|
| 3,518,170 A * | 6/1970 | Koretzky ................. 205/260 |
| 4,002,786 A | 1/1977 | Hirohata et al. |
| 4,009,087 A | 2/1977 | Kardos et al. |
| 4,099,974 A | 7/1978 | Morishita et al. |
| 4,133,908 A | 1/1979 | Madsen |
| 4,192,764 A | 3/1980 | Madsen |
| 4,211,564 A | 7/1980 | Oka |
| 4,248,633 A | 2/1981 | Heijnen et al. |
| 4,303,443 A | 12/1981 | Miyazawa et al. |
| 4,371,397 A | 2/1983 | Honma et al. |
| 4,548,644 A | 10/1985 | Nakaso et al. |
| 4,557,762 A | 12/1985 | Nakaso et al. |
| 4,559,166 A | 12/1985 | Morinaga et al. |
| 4,563,217 A | 1/1986 | Kikuchi et al. |
| 4,695,505 A | 9/1987 | Dutkewych |
| 4,777,078 A | 10/1988 | Miyabayashi |
| 4,834,796 A | 5/1989 | Kondo et al. |
| 5,021,135 A | 6/1991 | Wilson et al. |
| 5,039,338 A | 8/1991 | Kondo et al. |
| 5,076,840 A | 12/1991 | Takita et al. |
| 5,358,992 A | 10/1994 | Dershem et al. |
| 5,419,926 A | 5/1995 | Soltys |
| 5,425,873 A | 6/1995 | Bladon et al. |
| 5,620,961 A | 4/1997 | Markovic et al. |
| 5,789,507 A | 8/1998 | Tanaka et al. |
| 5,897,692 A | 4/1999 | Kotsuka et al. |
| 5,965,211 A | 10/1999 | Kondo et al. |
| 6,107,426 A | 8/2000 | Shibutani |
| 6,183,545 B1 | 2/2001 | Okuhama et al. |
| 6,416,812 B1 | 7/2002 | Andricacos et al. |
| 6,627,544 B2 | 9/2003 | Izumi et al. |
| 6,652,731 B2 * | 11/2003 | Cobley et al. ............. 106/1.26 |
| 6,660,071 B2 | 12/2003 | Yoshida et al. |
| 6,664,122 B1 | 12/2003 | Andryuschenko et al. |
| 6,805,915 B2 | 10/2004 | Itabashi et al. |
| 6,855,378 B1 | 2/2005 | Narang |
| 2002/0152955 A1 | 10/2002 | Dordi et al. |
| 2003/0183120 A1 | 10/2003 | Itabashi et al. |
| 2007/0071904 A1* | 3/2007 | Yabe et al. ............... 427/443.1 |
| 2008/0038449 A1* | 2/2008 | Poole et al. ............. 427/443.1 |
| 2008/0038450 A1* | 2/2008 | Poole et al. ............. 106/1.23 |
| 2008/0038452 A1* | 2/2008 | Poole et al. ............. 106/1.23 |

FOREIGN PATENT DOCUMENTS

| | | |
|---|---|---|
| EP | 1 411 147 A1 | 4/2004 |
| GB | 1 397 091 | 7/1972 |
| JP | 1997316649 A | 9/1997 |
| JP | 1998072677 A | 3/1998 |
| JP | 2001148561 A | 5/2001 |
| WO | WO 2005/038086 A1 | 4/2005 |
| WO | WO 2005/038087 A1 | 4/2005 |
| WO | WO 2005/038088 A1 | 4/2005 |

OTHER PUBLICATIONS

Baum, et al., "Photoselective Plating of Metals for Circuitization and Top-surface Imaging", pp. 335-343, (date and publisher unavailable).
Sone, et al., "Electroless Copper Plating Using $Fe^{II}$ as a Reducing Agent", Science Direct, Electrochimica Acta 49 (2004), pp. 233-238, www.sciencedirect.com, no month available.
Terskaya, et al., "Electroless Nickel and Copper Plating of Carbon Fibers with the Use of Sulfur-containing Reducing Agents", Russian Journal of Applied Electrochemistry, vol. 77, No. 2 (2004), pp. 236-240, no month available.

* cited by examiner

*Primary Examiner*—Helene Klemanski
(74) *Attorney, Agent, or Firm*—John J. Piskorski

(57) ABSTRACT

Electroless copper and copper alloy plating baths are disclosed. The electroless baths are formaldehyde free and are environmentally friendly. The electroless baths are stable and deposit a bright copper or copper alloy on substrates.

8 Claims, No Drawings

FORMALDEHYDE FREE ELECTROLESS COPPER COMPOSITIONS

The present invention is directed to formaldehyde free electroless copper compositions. More specifically, the present invention is directed to formaldehyde free electroless copper compositions which are stable, provide uniform copper deposits and are environmentally friendly.

Electroless copper plating compositions, also known as baths, are in widespread use in metallization industries for depositing copper on various types of substrates. In the manufacture of printed wiring boards, for example, the electroless copper baths are used to deposit copper into through-holes and circuit paths as a base for subsequent electrolytic copper plating. Electroless copper plating also is used in the decorative plastics industry for deposition of copper onto non-conductive surfaces as a base for further plating of copper, nickel, gold, silver and other metals as required. Typical baths which are in commercial use today contain divalent copper compounds, chelating agents or complexing agents for the divalent copper ions, formaldehyde reducing agents and various addition agents to make the bath more stable, adjust the plating rate and brighten the copper deposit. Although many of such baths are successful and are widely used, the metallization industry has been searching for alternative electroless copper plating baths that do not contain formaldehyde due to its toxic nature.

Formaldehyde is known as an eye, nose and upper respiratory tract irritant. Animal studies have shown that formaldehyde is an in vitro mutagen. According to a WATCH committee report (WATCH/2005/06—Working group on Action to Control Chemicals—sub committee with UK Health and Safety Commission) over fifty epidemiological studies have been conducted prior to 2000 suggested a link between formaldehyde and nasopharyngeal/nasal cancer but were not conclusive. However, more recent studies conducted by IARC (International Agency for Research on Cancer) in the U.S.A. showed that there was sufficient epidemiological evidence that formaldehyde causes nasopharyngeal cancer in humans. As a result the INRS, a French agency, has submitted a proposal to the European Community Classification and Labelling Work Group to reclassify formaldehyde from a category 3 to a category 1 carcinogen. This would make usage and handling of it more restricted, including in electroless copper formulations. Accordingly, there is a need in the metallization industry for a comparable or improved reducing agent to replace formaldehyde. Such a reducing agent must be compatible with existing electroless copper processes; provide desired capability and reliability and meet cost targets.

Hypophosphites have been suggested as a replacement for formaldehyde; however, plating rates of baths containing this compound are generally too slow.

U.S. Pat. No. 5,897,692 discloses formaldehyde free electroless plating solutions. Compounds such as boron hydride salts and dimethylamine borane (DMAB) are included as reducing agents. However, such boron containing compounds have been tried with varying degrees of success. Further, these compounds are more expensive than formaldehyde and also have health and safety issues. DMAB is toxic. Additionally, resultant borates have adverse effects on crops on release into the environment.

Accordingly, there is still a need for an electroless copper bath which is free of formaldehyde and is both stable, provides acceptable copper deposits and is environmentally friendly.

In one aspect compositions include one or more sources of copper ions, one or more chelating agents chosen from one or more hydantoin and hydantoin derivatives and pyruvaldehyde.

In another aspect, methods include a) providing a substrate; and b) electrolessly depositing copper on the substrate using an electroless copper composition including one or more sources of copper ions, one or more chelating agents chosen from hydantoin and hydantoin derivatives and pyruvaldehyde.

In a further aspect, methods include a) providing a printed wiring board having a plurality of through-holes; b) desmearing the through-holes; and c) depositing copper on walls of the through-holes using an electroless copper composition including one or more sources of copper ions, one or more chelating agents chosen from hydantoin and hydantoin derivatives and pyruvaldehyde.

In still another aspect, the electroless copper compositions may include one or more additional metal ions to deposit a copper alloy on a substrate. Such additional metal ions include tin and nickel.

The electroless copper baths are formaldehyde free thus they are environmentally friendly. The environmentally friendly electroless copper plating compositions are stable during storage as well as during copper deposition. Additionally, the environmentally friendly electroless copper baths provide uniform copper deposits which have a uniform pink and smooth appearance, and generally meet industry standards desired for commercially acceptable electroless copper baths. The electroless copper compositions also plate copper at commercially acceptable rates.

As used throughout this specification, the abbreviations given below have the following meanings, unless the context clearly indicates otherwise: g=gram; mg=milligram; ml=milliliter; L=liter; cm=centimeter; 2.54 cm/inch; m=meter; mm=millimeter; μm=micron; min.=minute; ppm=parts per million; ° C.=degrees Centigrade; M=molar; g/L=grams per liter; wt %=percent by weight; $T_g$=glass transition temperature; and dyne=1 g-cm/second$^2$=($10^{-3}$ Kg) ($10^{-2}$ m)/second$^2$=$10^{-5}$Newtons.

The terms "printed circuit board" and "printed wiring board" are used interchangeably throughout this specification. The terms "plating" and "deposition" are used interchangeably throughout this specification. A dyne is a unit of force. All amounts are percent by weight, unless otherwise noted. All numerical ranges are inclusive and combinable in any order except where it is logical that such numerical ranges are constrained to add up to 100%.

Electroless copper compositions are formaldehyde free and are environmentally friendly. They also are stable during storage and during electroless copper deposition. The compositions provide a copper deposit with a uniform salmon pink appearance. The compositions include one or more sources of copper ions, one or more chelating agents chosen from hydantoin and hydantoin derivatives and pyruvaldehyde. Conventional additives also may be included in the compositions. Additives include, but are not limited to, one or more complexing agents, stabilizers such as those which adjust mechanical properties, provide rate control, refine grain structure and modify deposit stress, buffering agents and one or more sources of alloying metals.

Sources of copper ions include, but are not limited to, water soluble halides, nitrates, acetates, sulfates and other organic and inorganic salts of copper. Mixtures of one or more of such copper salts may be used to provide copper ions. Examples include copper sulfate, such as copper sulfate pentahydrate, copper chloride, copper nitrate, copper hydroxide and copper sulfamate. Conventional amounts of copper salts may be used in the compositions. Copper ion concentrations in the composition may range from 0.5 g/L to 30 g/L or such as from 1 g/L to 20 g/L or such as from 5 g/L to 10 g/L.

Chelating agents are chosen from one or more of hydantoin and hydantoin derivatives. Hydantoin derivatives include, but are not limited to, 1-methylhydantoin, 1,3-dimethylhydantoin, 5,5-dimethylhydantoin and allantoin. Typically the chelating agents are chosen from hydantoin and 5,5-dimethylhydantoin. More typically, the chelating agent is 5,5-dimethylhaydantoin. Such chelating agents are included in the compositions in amounts of 20 g/l to 150 g/L or such as from 30 g/L to 100 g/L or such as 40 g/l to 80 g/L.

Pyruvaldehyde functions as a reducing agent and replaces the environmentally unfriendly formaldehyde, which is a carcinogen. Pyruvaldehyde is included in amounts of 10 g/L to 100 g/l or such as from 20 g/L to 80 g/L or such as from 30 g/L to 60 g/L.

Surfactants also may be included in the compositions. Conventional surfactants may be included in the compositions. Such surfactants include ionic, non-ionic and amphoteric surfactants. Ionic surfactants include conventional anionic and cationic surfactants. Typically the surfactants are non-ionic. Examples of non-ionic surfactants are alkyl phenoxy polyethoxyethanols, polyoxyethylene polymers having from 20 to 150 repeating units and block copolymers of polyoxyethylene and polyoxypropylene. Surfactants may be used in conventional amounts. Typically surfactants are used in amounts of 0.5 g/L to 20 g/L or such as from 1 g/L to 10 g/L.

Alkaline compounds are included in the electroless copper plating compositions to maintain a pH of 9 and higher. A high pH is desirable because oxidation potentials for reducing agents are shifted to more negative values as the pH increases thus making the copper deposition thermodynamically favorable. Typically the electroless copper plating compositions have a pH from 10 to 14. More typically the electroless copper plating compositions have a pH from 11.5 to 13.5.

One or more compounds which provide an alkaline composition within the desired pH ranges may be used. Alkaline compounds include, but are not limited to, one or more alkaline hydroxides such as sodium hydroxide, potassium hydroxide and lithium hydroxide. Typically sodium hydroxide, potassium hydroxide or mixtures thereof are used. More typically sodium hydroxide is used. Such compounds may be included in amounts of 5 g/L to 100 g/L or such as from 10 g/L to 80 g/L.

One or more alloying metals also may be included in the electroless compositions to form binary or ternary alloys of copper. Such alloying metals include, but are not limited to, nickel and tin. Examples of copper alloys include copper/nickel and copper/tin. Typically the copper alloy is copper/nickel.

Sources of nickel ions may include one or more conventional water soluble salts of nickel. Sources of nickel ions include, but are not limited to, nickel sulfates and nickel halides. Sources of nickel ions may be included in the electroless alloying compositions in conventional amounts. Typically sources of nickel ions are included in amounts of 0.5g/L to 10 g/L or such as from 1 g/l to 5 g/L.

Sources of tin ions may include one or more conventional water soluble salts of tin. Sources of tin ions include, but are not limited to, tin sulfates, tin halides and organic tin sulfonates. Sources of tin ions may be included in the electroless compositions in conventional amounts. Typically sources of tin ions are included in amounts of 0.5 g/L to 10 g/L or such as 1 g/L to 5 g/L.

Optionally, the electroless copper compositions may include one or more conventional additives. Such conventional additives include, but are not limited to, sulfur containing compounds such as mercaptosuccinic acid, dithiodisuccinic acid, mercaptopyridine, mercaptobenzothiazole, thiourea; compounds such as pyridine, purine, quinoline, indole, indazole, imidazole, pyrazine and their derivatives; alcohols such as alkyne alcohols, allyl alcohols, aryl alcohols and cyclic phenols; hydroxy substituted aromatic compounds such as methyl-3,4,5-trihydroxybenzoate, 2,5-dihydroxy-1,4-benzoquinone and 2,6-dihydroxynaphthalene; carboxylic acids, such as citric acid, tartaric acid, succinic acid, malic acid, malonic acid, lactic acid, acetic acid and salts thereof; amines; amino acids; aqueous soluble metal compounds such as metal chlorides and sulfates; silicon compounds such as silanes, siloxanes and low to intermediate molecular weight polysiloxanes; germanium and its oxides and hydrides; and polyalkylene glycols, cellulose compounds, alkylphenyl ethoxylates and polyoxyethylene compounds; and stabilizers such as pyridazine, methylpiperidine, 1,2-di-(2-pyridyl)ethylene, 1,2-di-(pyridyl)ethylene, 2,2'-dipyridylamine, 2,2'-bipyridyl, 2,2'-bipyrimidine, 6,6'-dimethyl-2,2'-dipyridyl, di-2-pyrylketone, N,N,N',N'-tetraethylenediamine, naphthalene, 1,8-naphthyridine, 1,6-naphthyridine, tetrathiafurvalene, terpyridine, pththalic acid, isopththalic acid and 2,2'-dibenzoic acid. Such additives may be included in the electroless copper compositions in amounts of 0.01 ppm to 1000 ppm or such as from 0.05 ppm to 10 ppm.

Other optional additives include, but are not limited to, Rochelle salts, sodium salts of ethylenediamine tetraacetic acid, nitriloacetic acid and its alkali metal salts, triethanolamine, modified ethylene diamine tetraacetic acids such as N-hydroxyethylenediamine triacetate, hydroxyalkyl substituted dialkaline triamines such as pentahydroxy propyldiethylenetriamine and compounds such as N,N-dicarboxymethyl L-glutamic acid tetrasodium salt. Also s,s-ethylene diamine disuccinic acid and N,N,N',N'-tetrakis (2-hydroxypropyl) ethytlenediamine(ethylenedinitrilo)tetra-2-propanol may be included. Such additives typically are used a complexing agent to keep copper (II) in solution. Such complexing agents may be included in the compositions in conventional amounts. Typically complexing agents are included in amounts of from 1 g/L to 50 g/l or such as from 10 g/L to 40 g/L.

The electroless copper and copper alloy compositions may be used to deposit a copper or copper alloy on both conductive and non-conductive substrates. The electroless compositions may be used in many conventional methods known in the art. Typically copper or copper alloy deposition is done at temperatures of 20° C. to 80°. More typically the electroless compositions deposit copper or copper alloys at temperature of 30° C. to 60° C. The substrate to be plated with copper or copper alloy is immersed in the electroless composition or the electroless composition is sprayed onto the substrate. Conventional plating times may be used to deposit the copper or copper alloy onto the substrate. Deposition may be done for 5 seconds to 30 minutes; however, plating times may vary depending on the thickness of the copper or copper alloy desired on the substrate.

Copper and Copper alloy plating rates may range from 0.01 µm/20 minutes to 3µm/20 minutes or such as from 0.5 µm/20 minutes to 2 µm/20 minutes. Typically copper and copper alloy plating rates may range from 0.5 µm/20 minutes to 3 µm/20 minutes. Copper deposition below 0.01 µm/20 minutes is too slow a rate such that the deposition process is unavailable to the metallization industry. Rates exceeding 3 µm/20 minutes are too fast and result in poor adhesion as well as interconnect defects. Further, the foregoing plating rates indicate the effectiveness of copper deposition in the presence of a catalyst. Optimum plating rates suggest good grain structure and mechanical properties.

Substrates include, but are not limited to, materials including inorganic and organic substances such as glass, ceramics, porcelain, resins, paper, cloth and combinations thereof. Metal-clad and unclad materials also are substrates which may be plated with the electroless copper and copper alloy compositions.

Substrates also include printed circuit boards. Such printed circuit boards include metal-clad and unclad with thermosetting resins, thermoplastic resins and combinations thereof, including fiber, such as fiberglass, and impregnated embodiments of the foregoing.

Thermoplastic resins include, but are not limited to, acetal resins, acrylics, such as methyl acrylate, cellulosic resins, such as ethyl acetate, cellulose propionate, cellulose acetate butyrate and cellulose nitrate, polyethers, nylon, polyethylene, polystyrene, styrene blends, such as acrylonitrile styrene and copolymers and acrylonitrile-butadiene styrene copolymers, polycarbonates, polychlorotrifluoroethylene, and vinylpolymers and copolymers, such as vinyl acetate, vinyl alcohol, vinyl butyral, vinyl chloride, vinyl chloride-acetate copolymer, vinylidene chloride and vinyl formal.

Thermosetting resins include, but are not limited to, allyl phthalate, furane, melamine-formaldehyde, phenol-formaldehyde and phenol-furfural copolymers, alone or compounded with butadiene acrylonitrile copolymers or acrylonitrile-butadiene-styrene copolymers, polyacrylic esters, silicones, urea formaldehydes, epoxy resins, allyl resins, glyceryl phthalates and polyesters.

Porous materials include, but are not limited to paper, wood, fiberglass, cloth and fibers, such as natural and synthetic fibers, such as cotton fibers and polyester fibers.

The electroless copper and copper alloy compositions may be used to plate both low and high $T_g$ resins. Low $T_g$ resins have a $T_g$ below 160° C. and high $T_g$ resins have a $T_g$ of 160° C. and above. Typically high $T_g$ resins have a $T_g$ of 160° C. to 280° C. or such as from 170° C. to 240° C. High $T_g$ polymer resins include, but are not limited to, polytetrafluoroethylene (PTFE) and polytetrafluoroethylene blends. Such blends include, for example, PTFE with polypheneylene oxides and cyanate esters. Other classes of polymer resins which include resins with a high $T_g$ include, but are not limited to, epoxy resins, such as difunctional and multifunctional epoxy resins, bimaleimide/triazine and epoxy resins (BT epoxy), epoxy/polyphenylene oxide resins, acrylonitrile butadienestyrene, polycarbonates (PC), polyphenylene oxides (PPO), polypheneylene ethers (PPE), polyphenylene sulfides (PPS), polysulfones (PS), polyamides, polyesters such as polyethyleneterephthalate (PET) and polybutyleneterephthalate (PBT), polyetherketones (PEEK), liquid crystal polymers, polyurethanes, polyetherimides, epoxies and composites thereof.

In one embodiment the electroless compositions may be used to deposit copper or copper alloys on the walls of through-holes or vias of printed circuit boards. The electroless compositions may be used in both horizontal and vertical processes of manufacturing printed circuit boards.

In one embodiment through-holes are formed in the printed circuit board by drilling or punching or any other method known in the art. After the formation of the through-holes, the boards are rinsed with water and a conventional organic solution to clean and degrease the board followed by desmearing the through-hole walls. Typically desmearing of the through-holes begins with application of a solvent swell.

Any conventional solvent swell may be used to desmear the through-holes. Solvent swells include, but are not limited to, glycol ethers and their associated ether acetates. Conventional amounts of glycol ethers and their associated ether acetates may be used. Such solvent swells are well known in the art. Commercially available solvent swells include, but are not limited to, CIRCUPOSIT CONDITIONER™ 3302, CIRCUPOSIT HOLE PREP™ 3303 and CIRCUPOSIT HOLE PREP™ 4120 (obtainable from Rohm and Haas Electronic Materials, Marlborough, Mass.).

Optionally, the through-holes are rinsed with water. A promoter is then applied to the through-holes. Conventional promoters may be used. Such promoters include sulfuric acid, chromic acid, alkaline permanganate or plasma etching. Typically alkaline permanganate is used as the promoter. An example of a commercially available promoter is CIRCUPOSIT PROMOTER™ 4130 available from Rohm and Haas Electronic Materials, Marlborough, Mass.

Optionally, the through-holes are rinsed again with water. A neutralizer is then applied to the through-holes to neutralize any residues left by the promoter. Conventional neutralizers may be used. Typically the neutralizer is an aqueous alkaline solution containing one or more amines or a solution of 3 wt % peroxide and 3 wt % sulfuric acid. Optionally, the through-holes are rinsed with water and the printed circuit boards are dried.

After desmearing an acid or alkaline conditioner may be applied to the through-holes. Conventional conditioners may be used. Such conditioners may include one or more cationic surfactants, non-ionic surfactants, complexing agents and pH adjusters or buffers. Commercially available acid conditioners include, but are not limited to, CIRCUPOSIT CONDITIONER™ 3320 and CIRCUPOSIT CONDITIONER™ 3327available from Rohm and Haas Electronic Materials, Marlborough, Mass. Suitable alkaline conditioners include, but are not limited to, aqueous alkaline surfactant solutions containing one or more quaternary amines and polyamines. Commercially available alkaline surfactants include, but are not limited to, CIRCUPOSIT CONDITIONER™231, 3325, 813 and 860 available from Rohm and Haas Electronic Materials. Optionally, the through-holes are rinsed with water after conditioning.

Conditioning is followed by microetching the through-holes. Conventional microetching compositions may be used. Microetching is designed to provide a micro-roughened copper surface on exposed copper (e.g. innerlayers and surface etch) to enhance subsequent adhesion of deposited electroless and electroplate. Microetches include, but are not limited to, 60 g/L to 120 g/L sodium persulfate or sodium or potassium oxymonopersulfate and sulfuric acid (2%) mixture, or generic sulfuric acid/hydrogen peroxide. An example of a commercially available microetching composition includes CIRCUPOSIT MICROETCH™ 3330 available from Rohm and Haas Electronic Materials. Optionally, the through-holes are rinsed with water.

A pre-dip is then applied to the microetched through-holes. Examples of pre-dips include 2% to 5% hydrochloric acid or an acidic solution of 25 g/L to 75 g/L sodium chloride. Optionally, the through-holes are rinsed with cold water.

A catalyst is then applied to the through-holes. Any conventional catalyst may be used. The choice of catalyst depends on the type of metal to be deposited on the walls of the through-holes. Typically the catalysts are colloids of noble and non-noble metals. Such catalysts are well known in the art and many are commercially available or may be prepared from the literature. Examples of non-noble metal catalysts include copper, aluminum, cobalt, nickel, tin and iron.

Typically noble metal catalysts are used. Suitable noble metal colloid catalysts include, for example, gold, silver, platinum, palladium, iridium, rhodium, ruthenium and osmium. More typically, noble metal catalysts of silver, platinum, gold and palladium are used. Most typically silver and palladium are used. Suitable commercially available catalysts include, for example, CIRCUPOSIT CATALYST™ 334 and CATAPOSIT™ 44 available from Rohm and Haas Electronic Materials. The through-holes optionally may be rinsed with water after application of the catalysts.

The walls of the through-holes are then plated with copper or copper alloy with an electroless composition as described above. Typically copper is plated on the walls of the through-holes. Plating times and temperatures are also described above.

After the copper or copper alloy is deposited on the walls of the through-holes, the through-holes are optionally rinsed with water. Optionally, anti-tarnish compositions may be applied to the metal deposited on the walls of the through-holes. Conventional anti-tarnish compositions may be used. Examples of anti-tarnish compositions include ANTI TARNISH™ 7130 and CUPRATEC™ 3 (obtainable from Rohm and Haas Electronic Materials). The through-holes may optionally be rinsed by a hot water rinse at temperatures exceeding 30° C. and then the boards may be dried.

In an alternative embodiment the through-holes may be treated with an alkaline hydroxide solution after desmear to prepare the through-holes for electroless deposition of copper or copper alloy. This alternative embodiment for plating through-holes or vias is typically used when preparing high $T_g$ boards for plating. The alkaline hydroxide solution contacts the through-holes for 30 seconds to 120 seconds or such as from 60 seconds to 90 seconds. Application of the alkaline hydroxide composition between the desmearing and plating the through-holes provides for good coverage of the through-hole walls with the catalyst such that the copper or copper alloy covers the walls. The alkaline hydroxide solution is an aqueous solution of sodium hydroxide, potassium hydroxide or mixtures thereof. The hydroxides are included in amounts of 0.1 g/L to 100 g/L or such as from 5 g/L to 25 g/L. Typically the hydroxides are included in the solutions in amounts of 15 g/L to 20 g/l. Typically the alkaline hydroxide is sodium hydroxide. If the alkaline hydroxide solution is a mixture of sodium hydroxide and potassium hydroxide, the sodium hydroxide and potassium hydroxide are in a weight ratio of 4:1 to 1:1, or such as from 3:1 to 2:1.

Optionally one or more surfactants may be added to the alkaline hydroxide solution. Typically the surfactants are non-ionic surfactants. The surfactants reduce surface tension to enable proper wetting of the through-holes. Surface tension after application of the surfactant in the through-holes ranges from 25 dynes/cm to 50 dynes/cm, or such as from 30 dynes/cm to 40 dynes/cm. Typically the surfactants are included in the formulation when the alkaline hydroxide solution is used to treat small through-holes to prevent flaring. Small through-holes typically range in diameter of 0.2 mm to 0.5 mm. In contrast, large through-holes typically range in diameter of 0.5 mm to 1 mm. Aspect ratios of through-holes may range from 1:1 to 20:1.

Surfactants are included in the alkaline hydroxide solutions in amounts of 0.05 wt % to 5 wt %, or such as from 0.25 wt % to 1 wt %. Suitable non-ionic surfactants include, for example, aliphatic alcohols such as alkoxylates. Such aliphatic alcohols have ethylene oxide, propylene oxide, or combinations thereof, to produce a compound having a polyoxyethylene or polyoxypropylene chain within the molecule, i.e., a chain composed of recurring ($—O—CH_2—CH_2—$) groups, or chain composed of recurring ($—O—CH_2—CH—CH_3$) groups, or combinations thereof. Typically such alcohol alkoxylates are alcohol ethoxylates having carbon chains of 7 to 15 carbons, linear or branched, and 4 to 20 moles of ethoxylate, typically 5 to 40 moles of ethoxylate and more typically 5 to 15 moles of ethoxylate.

Many of such alcohol alkoxylates are commercially available. Examples of commercially available alcohol alkoxylates include, for example, linear primary alcohol ethoxylates such as NEODOL 91-6, NEODOL 91-9 ($C_9$-$C_{11}$ alcohols having an average of 6 to 9 moles of ethylene oxide per mole of linear alcohol ethoxylate) and NEODOL 1-73B ($C_{11}$ alcohol with an average blend of 7 moles of ethylene oxide per mole of linear primary alcohol ethoxylate). Both are available from Shell Oil Company, Houston Tex.

After the through-holes are treated with the alkaline hydroxide solution, they may be treated with an acid or alkaline conditioner. The through-holes are then micro-etched and applied with a pre-dip followed by applying a catalyst. The through-holes are then electrolessly plated with copper or copper alloy.

After the through-holes are plated with copper or copper alloy, the substrates may undergo further processing. Further processing may include conventional processing by photoimaging and further metal deposition on the substrates such as electrolytic metal deposition of, for example, copper, copper alloys, tin and tin alloys.

While not being bound by theory, the chelating agents hydantoin, 1-methylhydantoin, 1,3-dimethylhydantoin and 5,5-dimethylhydantoin in combination with pyruvaldehyde enable a controlled autocatalytic deposition of copper or copper alloys on substrates. These chelating agents in combination with pyruvaldehyde prevent the formation of copper oxide ($Cu_2O$) in the bath. Copper oxide is readily formed in many formaldehyde free conventional electroless copper plating solutions at high pH ranges. Such copper oxide formation destabilizes the electroless copper and copper alloy compositions and compromises the deposition of copper and copper alloys on substrates. The inhibition of the copper oxide formation enables the autocatalytic process to operate at high pH ranges where copper and copper alloy deposition is thermodynamically favorable.

The electroless copper and copper alloy compositions are free of formaldehyde and are environmentally friendly. They are stable during storage and during electroless deposition. They deposit a uniform copper or copper alloy layer on a substrate which is uniform salmon pink appearance. The uniform salmon pink appearance typically indicates that the copper deposit is smooth and fine grained. A fine grain provides good adhesion, coverage and mechanical properties. A dark deposit may indicate coarseness, roughness and nodular formation.

The following examples are not intended to limit the scope of the invention but are intended to further illustrate it.

EXAMPLE 1

Six aqueous electroless copper compositions included pyruvaldehyde and 5,5-dimethylhydantoin. The electroless copper compositions were free of formaldehyde and were environmentally friendly. They were tested for their stability, plating rate and quality of their copper deposits. Each aqueous electroless composition included at least 7g/L of copper chloride ($CuCl_2 \cdot 2H_2O$), 47 g/L of pyruvaldehyde and 64 g/L of 5,5-dimethylhydantoin. In addition compositions 2-6 also included one or more conventional complexing or additional chelating agent in conventional amounts.

The temperature of the compositions was maintained at 55° C. and a pH of 13.2 during electroless copper deposition. Copper was deposited on substrates for 20 minutes. The substrates used were six unclad FR4 epoxy/glass laminates with dimensions 1.5 inches×1.5 inches (2.54 cm/inch). The printed circuit boards were obtained from Isola Laminate Systems Corp., LaCrosse Wis. The process was as follows:

1. The surface of each laminate was immersed in an aqueous bath containing 5% of the aqueous acid conditioner CIRCUPOSIT CONDITIONER™ 3327 for 6 minutes at 50° C.
2. Each laminate was then rinsed with cold water for 6 minutes.
3. A pre-dip was then applied to each laminate for 1 minute at room temperature. The pre-dip was Pre-dip™ 3340 obtainable from Rohm and Haas Electronic Materials.
4. The laminates were then primed for 6 minutes at 40° C. with a catalyst for electroless copper metallization. The laminates were primed by immersing the laminates in the catalyst. The catalyst had the following formulation:

TABLE 1

| COMPONENT | AMOUNT |
| --- | --- |
| Palladium Chloride ($PdCl_2$) | 1 g |
| Sodium Stannate ($Na_2SnO_3 3H_2O$) | 1.5 g |
| Tin chloride ($SnCl_2$) | 40 g |
| Water | To one liter |

5. The laminates were then rinsed with cold water for 5 minutes.
6. Each laminate was then immersed in one of the electroless copper plating compositions described above for copper metal deposition. Copper metal deposition was done over 20 minutes. No red precipitate ($Cu_2O$ formation) was observed during copper plating.
7. The copper plated laminates were then rinsed with cold water for 2 minutes.
8. Each copper plated laminate was then rinsed with deionized water for one minute.
9. Each copper plated laminate was then placed into a conventional convection oven and dried for 20 minutes at 105° C.
10. After drying each copper plated laminate was placed in a conventional laboratory dessicator for 20 minutes or until it cooled to room temperature.
11. After drying each copper plated laminate was observed for the quality of the copper deposit. All appeared to have a good or very good appearance except for 5 which was dark brown (see Table below).
12. Each copper plated laminate was then weighed on a conventional balance and recorded.
13. After weighing and recording the weight of each laminate, the copper deposit was etched from each laminate by immersing the laminate in a 3% sulfuric acid/3% hydrogen peroxide solution.
14. Each laminate was then rinsed with cold water for 3 minutes.
15. Each laminate was then put back in the oven for 20 minutes at 105° C.
16. The laminates were then placed in a dessicator for 20 minutes or until it reached room temperature.
17. The laminates were then weighed and the weight difference before etching and after etching was determined. The weight difference for each laminate is in the table below.

TABLE 2

| COMPOSITION | STABILITY | RATE (μm/20 minutes) | APPEARANCE |
| --- | --- | --- | --- |
| 1 | No precipitate | 0.0880 | Salmon pink |
| 2 | No precipitate | 2.1560 | Salmon pink |
| 3 | No precipitate | 0.4640 | Salmon pink |
| 4 | No precipitate | 2.4880 | Salmon pink |
| 5 | No precipitate | 0.0480 | Dark brown |
| 6 | No precipitate | 0.8480 | Salmon pink |

All of the electroless copper compositions were stable. There was no observable $Cu_2O$ precipitate. All except one of the copper deposits appeared salmon pink, which indicated that most of the copper deposits were uniform with a fine grain and suitable for industrial application. The dark brown appearance of the deposit from composition 5 may have been caused by passivation/oxidation of the copper deposit.

In addition to composition stability and good copper deposition, the plating rates exceeded 0.01 μm/20 minutes and were below 3 μm/20 minutes. The plating rates showed that the electroless copper compositions were effective for depositing copper with a catalyst. Accordingly, the plating rates were acceptable for industrial metallization.

EXAMPLE 2

Six aqueous electroless copper compositions included pyruvaldehyde and hydrantoin. They were tested for their stability, plating rate and quality of their copper deposits. Each aqueous electroless composition included at least 7 g/L of copper chloride ($CuCl_2$ $2H_2O$), 47 g/L of pyruvaldehyde and 50 g/L of hydantoin. The electroless copper compositions were formaldehyde free and environmentally friendly. In addition compositions 2-6 included one or more conventional complexing agent or additional chelating agent in conventional amounts.

The temperature of the compositions was maintained at 55° C. and a pH of 13.2 during electroless copper deposition. Copper was deposited on substrates for 20 minutes. The substrates used were six unclad FR4 epoxy/glass laminates with dimensions 1.5 inches×1.5 inches (2.54 cm/inch). The laminates were obtained from Isola Laminate System Corp., LaCrosse Wis. The process was the same as described in Example 1 above. The results of the tests are in the table below.

TABLE 3

| COMPOSITIONS | STABILITY | RATE (μm/20 minutes) | APPEARANCE |
| --- | --- | --- | --- |
| 1 | Red precipitate | 0.4800 | Salmon pink |
| 2 | Red precipitate | 0.4800 | Salmon pink |
| 3 | No precipitate | 1.0040 | Salmon pink |
| 4 | No precipitate | 0.4360 | Salmon pink |
| 5 | No precipitate | 0.4600 | Salmon pink |
| 6 | No precipitate | 0.0800 | Dark brown |

Compositions 1 and 2 were unstable as evidenced by the red precipitate ($Cu_2O$), however, the copper deposit from both compositions were uniform and fine grained. The remainder of the electroless copper compositions was stable and provided a uniform salmon pink deposit with fine grains except for composition 6. The dark brown appearance may have been caused by passivation/oxidation of the copper deposit.

In addition to composition stability and over all good copper deposition, the plating rate for all of the electroless compositions exceeded 0.01 μm/20 minutes and were under 3 μm/20 minutes. The plating rates also showed that the electroless copper compositions were effective for depositing copper in the presence of a catalyst. Accordingly, the rates were fast enough for industrial application but were not too fast as to cause interconnect defects.

EXAMPLE 3

Six aqueous electroless copper compositions included pyruvaldehyde and allantoin and were tested for their stability, plating rate and quality of their copper deposits. Each aqueous electroless composition included at least 7 g/L of copper chloride ($CuCl_2$ $2H_2O$), 47 g/L of pyruvaldehyde and 79 g/L of allantoin. In addition compositions 2-6 contained one or more conventional complexing or additional chelating agent in conventional amounts.

The temperature of the compositions was maintained at 55° C. and a pH of 13.2 during electroless copper deposition. Copper was deposited on substrates for 20 minutes. The substrates used were six unclad FR4 epoxy/glass laminates with dimensions 1.5 inches×1.5 inches (2.54 cm/inch). The laminates were obtained from Isola Laminate Systems Corp., LaCrosse Wis. The process for testing the compositions was the same as in Examples 1 and 2 above. The results are in the table below.

TABLE 4

| COMPOSITION | STABILITY | RATE (μm/20 minutes) | APPEARANCE |
| --- | --- | --- | --- |
| 1 | No precipitate | 0.0400 | Dark brown |
| 2 | No precipitate | 0.0400 | Dark brown |
| 3 | No precipitate | 0.0160 | Dark brown |
| 4 | No precipitate | 0.0680 | Salmon pink |
| 5 | No precipitate | 0.0560 | Dark brown |
| 6 | No precipitate | 0.0640 | Salmon pink |

All of the compositions were stable. No red precipitate was observed. The plating rates for the baths also were industrially acceptable because they exceeded a rate of 0.01 μm/20 minutes and were below a rate of 3 μm/20 minutes. However, dark brown deposits were plated from four of the six compositions. This was believed to be caused by passivation/oxidation. Additionally, the high stability of some of the compositions also may have been the cause for poor copper plating. However, two of the electroless compositions, compositions 4 and 6, had uniform salmon pink copper deposits with fine grain structure. Accordingly, two of the compositions had acceptable industrial performance.

What is claimed is:

1. A composition comprising one or more sources of copper ions, one or more chelating agents selected from the group consisting of hydantoin and hydantoin derivatives and pyruvaldehyde.

2. The composition of claim 1, wherein the chelating agents range from 20 g/L to 150 g/L.

3. The composition of claim 1, wherein the hydantoin derivatives are selected from the group consisting of 1-methylhydantoin, 1,3-dimethylhydantoin, 5,5-dimethylhydantoin and allantoin.

4. The composition of claim 1, wherein the pyruvaldehyde ranges from 10 g/L to 100 g/L.

5. The composition of claim 1, further comprising one or more additional metal ions.

6. A method comprising:
 a) providing a substrate; and
 b) electrolessly depositing copper on the substrate with an electroless copper composition comprising one or more sources of copper ions, one or more chelating agents selected from the group consisting of hydantoin and hydantoin derivatives and pyruvaldehyde.

7. A method comprising:
 a) providing a printed wiring board comprising a plurality of through-holes;
 b) desmearing the through-holes; and
 c) depositing copper on walls of the through-holes with an electroless copper bath comprising one or more sources of copper ions, one or more chelating agents selected from the group consisting of hydantoin and hydantoin derivatives and pyruvaldehyde.

8. The method of claim 7, wherein the electroless copper composition further comprises one or more additional metal ions.

* * * * *